United States Patent
Lin (10) Patent No.: US 7,027,550 B2
(45) Date of Patent: Apr. 11, 2006

(54) SHIFT REGISTER UNIT AND SIGNAL DRIVING CIRCUIT USING THE SAME

(75) Inventor: Hsiao-Yi Lin, Hsinchu (TW)

(73) Assignee: Toppoly Optoelectronics Corp., Chu-Nan (TW)

( * ) Notice: Subject to any disclaimer, the term of this patent is extended or adjusted under 35 U.S.C. 154(b) by 37 days.

(21) Appl. No.: 10/917,695

(22) Filed: Aug. 12, 2004

(65) Prior Publication Data

US 2005/0036581 A1     Feb. 17, 2005

(30) Foreign Application Priority Data

Aug. 13, 2003    (TW) ............................... 92122209 A (51) Int. Cl.
    *G11C 19/00*     (2006.01)
(52) U.S. Cl. .......................................... 377/64; 377/67
(58) Field of Classification Search ...................... None
    See application file for complete search history.

(56) References Cited

U.S. PATENT DOCUMENTS

| | | | | |
|---|---|---|---|---|
| 3,716,724 A | * | 2/1973 | Parrish et al. ................. | 377/79 |
| 3,745,371 A | * | 7/1973 | Suzuki ......................... | 377/79 |
| 3,829,711 A | * | 8/1974 | Crowle ......................... | 377/79 |
| 4,598,214 A | * | 7/1986 | Sexton ......................... | 327/213 |
| 6,018,559 A | * | 1/2000 | Azegami et al. ............... | 377/79 |
| 6,052,426 A | * | 4/2000 | Maurice ........................ | 377/78 |
| 6,483,889 B1 | * | 11/2002 | Kim et al. ..................... | 377/54 |
| 6,611,248 B1 | * | 8/2003 | Kanbara et al. ............ | 345/100 |
| 6,829,322 B1 | * | 12/2004 | Shih et al. ..................... | 377/78 |
| 6,879,313 B1 | * | 4/2005 | Kubota et al. .............. | 345/100 |
| 6,885,723 B1 | * | 4/2005 | Yu ................................. | 377/78 |

* cited by examiner

*Primary Examiner*—Kenneth B. Wells
*Assistant Examiner*—Cassandra Cox
(74) *Attorney, Agent, or Firm*—Liu & Liu (57) ABSTRACT

A shift register unit. The shift register unit outputs a shift register signal according to a clock signal, an inverse clock signal and a start signal. The shift register has first and second clock inversion circuits, and an inverter. In the first clock inversion circuit, a third PMOS transistor has a third source coupled to the first voltage, a third gate and a third drain. A fourth PMOS transistor has a fourth source coupled to the third drain, a fourth gate and a fourth drain coupled to the second voltage. A fifth PMOS transistor has a fifth source coupled to the third drain, a fifth drain coupled to the first gate, and a fifth gate. A sixth PMOS transistor having a sixth source coupled to the third gate, a sixth drain coupled to the second gate, and a sixth gate coupled to the fifth gate.

20 Claims, 6 Drawing Sheets

SHIFT REGISTER UNIT AND SIGNAL DRIVING CIRCUIT USING THE SAME

BACKGROUND OF THE INVENTION

1. Field of the Invention

The present invention relates to a shift register circuit, and more particularly, to a shift register circuit applied to LTPS (low temperature poly silicon) LCDs.

2. Description of the Related Art

Characteristics of high definition, multicolor display, low power consumption, lower voltage requirements and light weight make liquid crystal displays (LCDs) a leading display device technology. LCDs have been used for several years as mobile information displays in, for example, personal digital assistants (PDAs), portable computers, mobile phones, and the like.

Recently, CMOS shift register circuits are widely applied to LTPS liquid crystal display (LCD). However, at least eight masks are required to form the CMOS shift register circuit during the fabrication, and thus, the costs are raised.

For cost reduction consideration, PMOS shift registers, which require much less masks, were used recently by LCD makers. However, conventional PMOS shift registers use dynamic circuit operation, which does not have a latch circuit. Thus, the operation voltage range is very high, even high up to 2 |VDD-VSS|.

SUMMARY OF THE INVENTION

It is therefore an object of the present invention to provide a shift register unit with lower fabrication cost.

Another object of the present invention is to provide a shift register unit having a latch circuit and using static circuit operation. Thus, the shift register unit of the present invention has a lower operation voltage range.

According to the above mentioned object, one aspect of the present invention provides a shift register unit constructed by either PMOS or NMOS transistors, thereby decreasing the fabrication cost. The shift register unit of the present invention includes latch circuits to perform static circuit operation.

In accordance to one embodiment of the present invention, the shift register unit outputs a shift register signal according to a clock signal, an inverse clock signal and a start signal. In the shift register unit, a first clock inversion circuit receives the start signal and the clock signal. An inverter is coupled to two outputs of the first clock inversion circuit to output the shift register signal. A second clock inversion circuit has a first output and a second output coupled to the two outputs of the first clock inversion circuit respectively, and receives the start signal and the inverse clock signal.

In the shift register unit according to one embodiment of the present invention, the first and second clock inversion circuits and the inverter are constructed by PMOS transistors. The inverter includes a first PMOS transistor having a first source coupled to a first voltage, and a second PMOS transistor having a second source coupled to a first drain of the first PMOS transistor, and a second drain coupled to a second voltage.

In the first clock inversion circuit, a third PMOS transistor has a third source coupled to the first voltage, a third gate and a third drain. A fourth PMOS transistor has a fourth source coupled to the third drain, a fourth gate and a fourth drain coupled to the second voltage. A fifth PMOS transistor has a fifth source coupled to the third drain, a fifth drain coupled to the first gate, and a fifth gate. A sixth PMOS transistor having a sixth source coupled to the third gate, a sixth drain coupled to the second gate, and a sixth gate coupled to the fifth gate.

In the second signal inversion circuit, a seventh PMOS transistor has a seventh source coupled to the first voltage, a seventh gate coupled to the first drain, and a seventh drain. An eighth PMOS transistor has an eighth source coupled to the seventh drain, and an eighth drain and an eighth gate coupled to the second voltage. A ninth PMOS transistor has a ninth source coupled to the seventh drain, a ninth drain coupled to the first gate, and a ninth gate. A tenth PMOS transistor has a tenth source coupled to the seventh gate and the first drain, a tenth drain coupled to the second gate, and a tenth gate coupled to the ninth gate.

In another embodiment, the PMOS transistors may be substituted by NMOS transistors, in connection with similar circuits with appropriate modifications to accommodate the logic controls of NMOS transistors to result in similar functions of the shift register units as the shift register units using PMOS transistors.

The functional circuit of the shift register unit may include a mix of NMOS and PMOS transistors, or only NMOS or PMOS, at least for one or both of the first and second clock inversion circuit.

According to the above mentioned object, another aspect of the present invention provides a signal driving circuit for LTPS LCDs. The signal driving circuit has at least a first shift register unit and a second shift register unit to output shift register signals sequentially according to a clock signal, an inverse clock signal and a start signal. The first and second shift register units have the same structure described above. At this time, the first clock inversion circuit of the first shift register unit and the second clock inversion circuit of the second shift register unit are controlled by the clock signal. The second clock inversion circuit of the first shift register unit and the first clock inversion circuit of the second shift register unit are controlled by the inverse clock signal.

The first shift register unit may include either NMOS or PMOS transistors, and the second shift register unit may include the same or different type (NMOS or PMOS) of transistors as the first shift register unit.

BRIEF DESCRIPTION OF THE DRAWINGS

The present invention can be more fully understood by the subsequent detailed description and examples with reference made to the accompanying drawings, wherein.

DETAILED DESCRIPTION OF THE INVENTION

Figure 3:
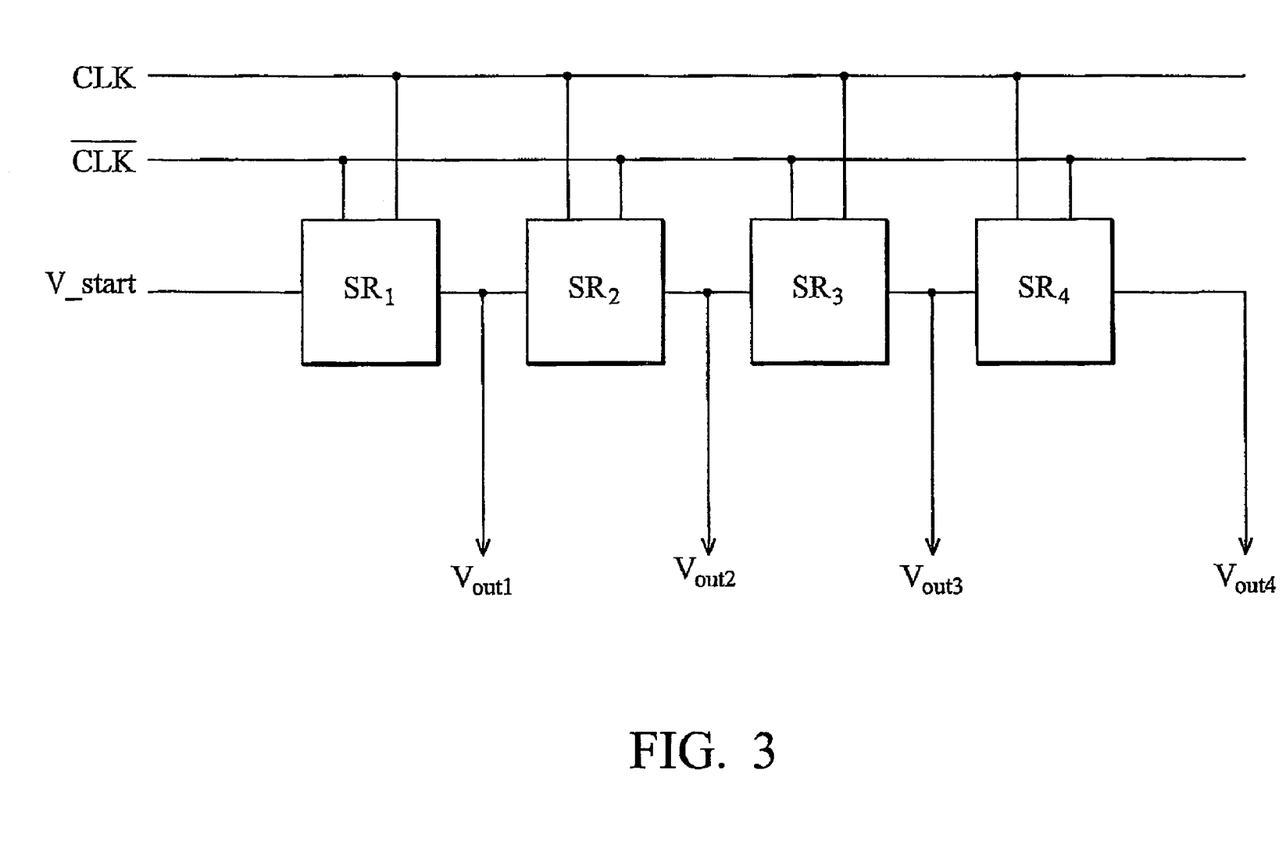
FIG. 3 is a block diagram of the signal driving circuit for LTPS LCDs according to the present invention.

The present invention provides a signal driving circuit having a plurality of shift register units connected serially, as schematically shown in FIG. 3. The serial shift register units output signals in turn. The input signal of the present-stage shift register unit is the output signal of the pre-stage shift register unit. The present-stage shift register unit outputs a signal at a predetermined delay, and the output signal is input to the next-stage shift register unit. Thus, the shift register circuit outputs a plurality of pulses for driving the LCD panel.

Figure 1:
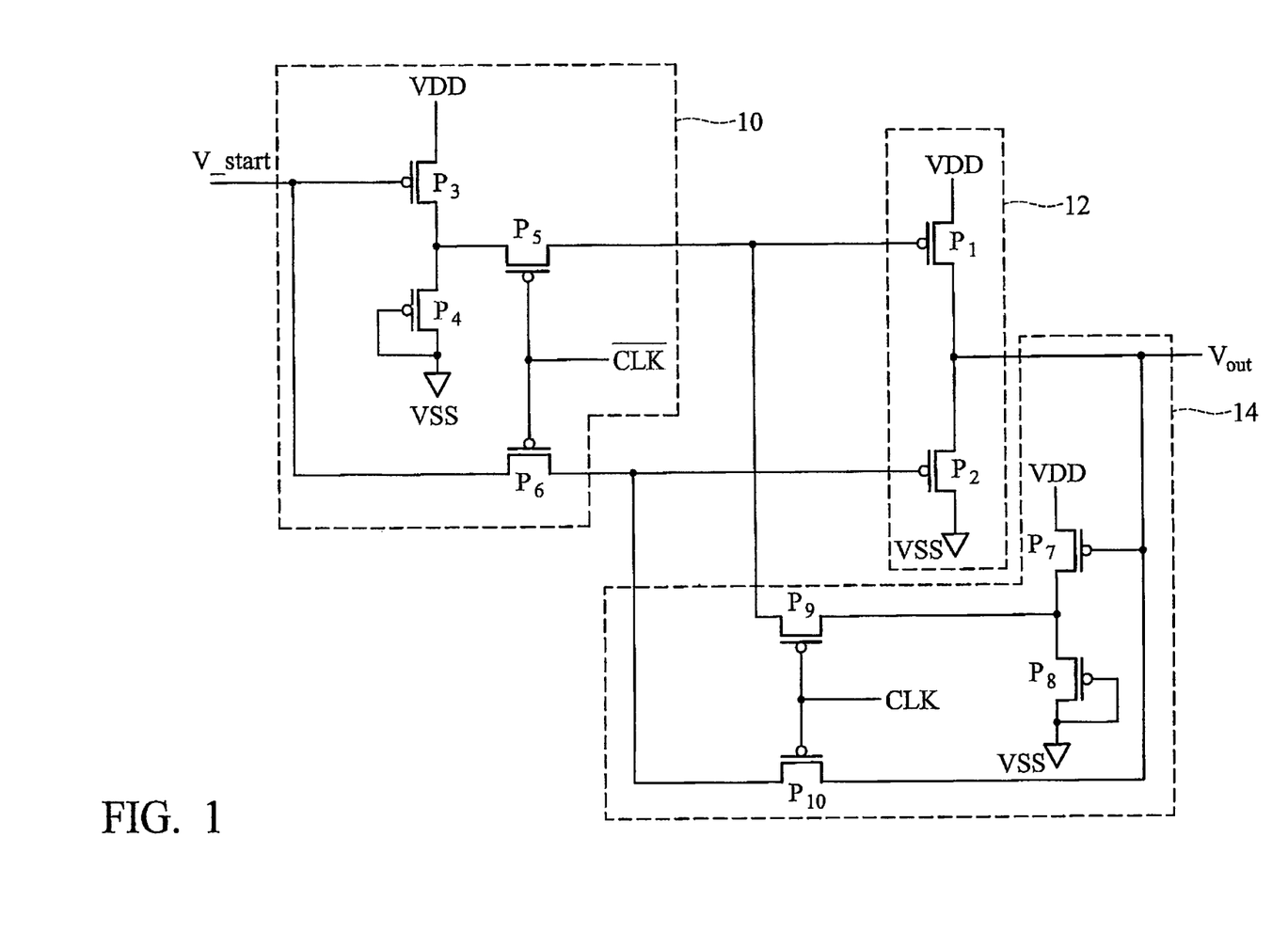
FIG. 1 is a circuit diagram of the shift register unit according to the present invention.

FIG. 1 is a circuit diagram of the shift register unit according to the present invention. Each shift register unit has a first clock inversion circuit 10, an inverter 12, and a second clock inversion circuit 14. For easy explanation, all the transistors in the first clock inversion circuit 10, the inverter 12, and the second clock inversion circuit 14 shown in FIG. 1 are PMOS transistors. However, according to the present invention, the transistors in the shift register unit can also be NMOS transistors. Alternatively, the transistors in the shift register can also be a combination of PMOS and NMOS transistors. The first clock inversion circuit 10 receives an output signal as a start signal V_start from the pre-stage shift-register unit (not shown), with the detailed circuit of the first clock inversion circuit described in the following.

The PMOS transistor P3 has a gate to receive the start signal V_start, a source coupled to a first voltage (VDD), such as power voltage, and a drain coupled to the source of the PMOS transistor P4. The PMOS transistor P4 has a gate and a drain coupled to a second voltage (VSS), such as ground voltage. The PMOS transistor P5 has a source coupled to the source of the PMOS transistor P4, and a gate coupled to the gate of the PMOS transistor P6. The PMOS transistor P5 further has a drain coupled to the gate of the PMOS transistor P1 to serve as a first output. The gates of the PMOS transistors P5 and P6 serve as a control terminal to receive the clock signal $\overline{CLK}$. The PMOS transistor P6 has a source coupled to the start signal V_start, and a drain coupled to the gate of the PMOS transistor P2 to serve as a second output.

The inverter 12 is composed of PMOS transistors P1 and P2, wherein the output signal thereof serves as the shift register signal Vout. The PMOS transistor P1 has a source coupled to the first voltage VDD, a gate coupled to the drain of the PMOS transistor P5, and a drain coupled to the source of the PMOS transistor P2. The drain of the PMOS transistor P1 and the source of the PMOS transistor P2 serve as an output to output the shift register signal Vout. The PMOS transistor P2 has a gate coupled to the drain of the PMOS transistor P6, and a drain coupled to the second voltage VSS.

The second clock inversion circuit 14 and the first clock inversion circuit 10 have a similar structure. In the second clock inversion circuit 14, the PMOS transistor P7 has a gate to receive the output signal Vout from the inverter 12, a source coupled to the first voltage VDD, and a drain coupled to the source of the PMOS transistor P8. The PMOS transistor P8 has a gate and a drain coupled to the second voltage VSS. The PMOS transistor P9 has a source coupled to the source of the PMOS transistor P8, and a gate coupled to the gate of the PMOS transistor P10. The PMOS transistor P9 further has a drain coupled to gate of the PMOS transistor P1 to serve as a first output. The gates of the PMOS transistors P9 and P10 serve as a control terminal to receive an inverse clock signal CLK. The PMOS transistor P10 has a source coupled to the gate of the PMOS transistor P7 and the shift register signal Vout from the inverter 12, and a drain coupled to the gate of the PMOS transistor P2 to serve as a second output.

Figure 2:
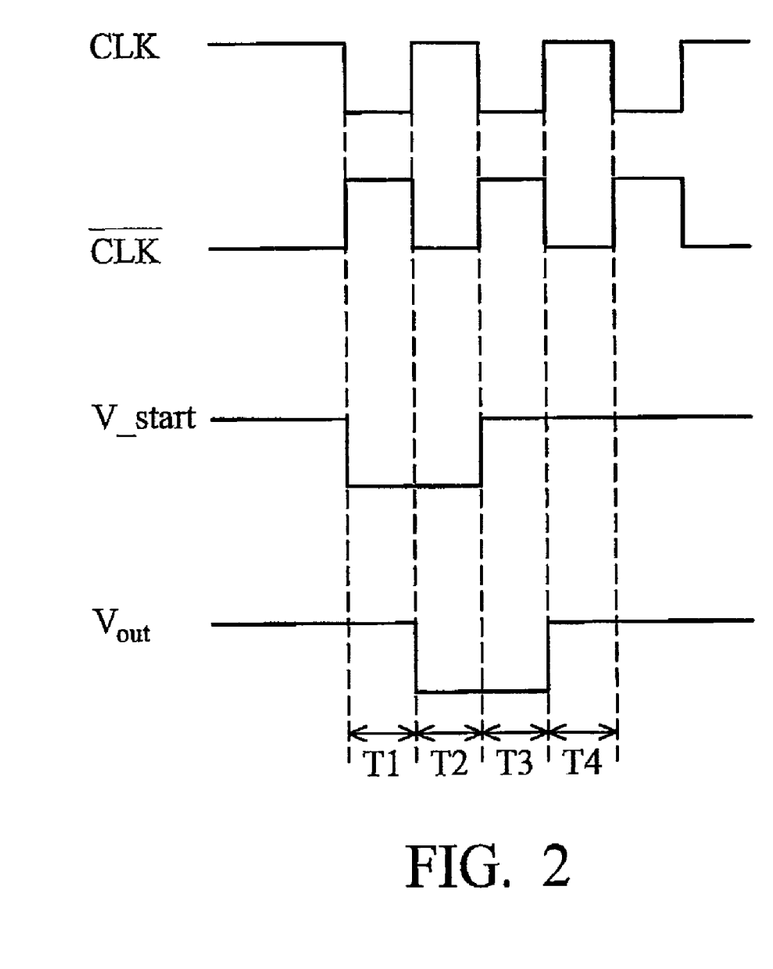
FIG. 2 is a timing diagram of the shift register unit according to the present invention.

FIG. 2 is a timing diagram of the shift register unit according to the present invention. During the period T1, the PMOS transistors P5 and P6 are turned off and the PMOS transistors P9 and P10 are turned on because the start signal V_start goes low and the clock signal $\overline{CLK}$ goes high respectively. At this time, the inverter 12 and the second clock inversion circuit 14 perform latch operation. Thus, the PMOS transistor P2 is turned off such that shift register signal Vout of the inverter 12 keeps the original state of the previous stage.

During the period T2, the PMOS transistors P5 and P6 are turned on and the PMOS transistors P9 and P10 are turned off because the clock signal $\overline{CLK}$ goes low and the inverse clock signal CLK goes high respectively. At this time, there is no latch operation. The start signal V_start downloads to the inverter 12, and the inverter 12 and the second clock inversion circuit 14 keep the same state as the start signal V_start. Further, the PMOS transistor P3 is turned on because the start signal V_start goes low, such that the PMOS transistors P1 is turned off and PMOS transistor P2 is turned on. Accordingly, the inverter 12 outputs a shift register signal Vout of low level due to turning on of the PMOS transistor P2.

During the period T3, the PMOS transistors P5 and P6 are turned off and the PMOS transistors P9 and P10 are turned on because the clock signal $\overline{CLK}$ goes high and the inverse clock signal CLK goes low respectively. At this time, the inverter 12 and the second clock inversion circuit 14 perform latch operation. Thus, the shift register signal Vout of the inverter 12 keeps the original state in period T2. Due to the shift register signal Vout of low level from the inverter 12, the PMOS transistor P7 is turned on, such that the PMOS transistor P1 maintains turning off. In addition, the PMOS transistor P2 stays on because of the shift register signal Vout of low level from the inverter 12. Accordingly, the inverter 12 maintains output of a low level shift register signal Vout due to the turning on of the PMOS transistor P2.

During the period T4, the PMOS transistors P5 and P6 are turned on and the PMOS transistors P9 and P10 turned off because the clock signal $\overline{CLK}$ goes low and the inverse clock signal CLK goes high. At this time, there is no latch operation. The start signal V_start downloads to the inverter 12, and the inverter 12 and the second clock inversion circuit 14 keep the same state as the start signal V_start. The PMOS transistors P2 and P3 are turned off and the PMOS transistor P1 turned on because the start signal V_start goes high. Accordingly, the inverter 12 stops output of a low level shift register signal Vout.

FIG. 3 is a block diagram of the signal driving circuit for LTPS LCDs according to the present invention. For example, the signal driving circuit has four shift register units SR1–SR4 connected serially. It should be noted that the control terminal in the first clock inversion circuit of each present-stage shift-register unit and the control terminal in the second clock inversion circuit of the pre-stage shift-register unit are controlled by the same clock signal.

For example, the control terminal (gates of the PMOS transistors P9 and P10) of the second clock inversion circuit 14 in the shift register unit SR1 and the control terminal (gates of the PMOS transistors P5 and P6) of the first clock inversion circuit 10 in the second shift register SR2 are coupled to an inverse clock signal CLK at the same time. Furthermore, the control terminal (gates of the PMOS transistors P9 and P10) of the second clock inversion circuit 14 in the shift register unit SR2 and the control terminal (gates of the PMOS transistors P5 and P6) of the first clock inversion circuit 10 in the second shift register SR3 are coupled to a clock signal $\overline{CLK}$ at the same time. In addition, the control terminal (gates of the PMOS transistors P9 and P10) of the second clock inversion circuit 14 in the shift register unit SR3 and the control terminal (gates of the PMOS transistors P5 and P6) of the first clock inversion circuit 10 in the second shift register SR4 are coupled to an inverse clock signal CLK at the same time, and so on.

Figure 5:
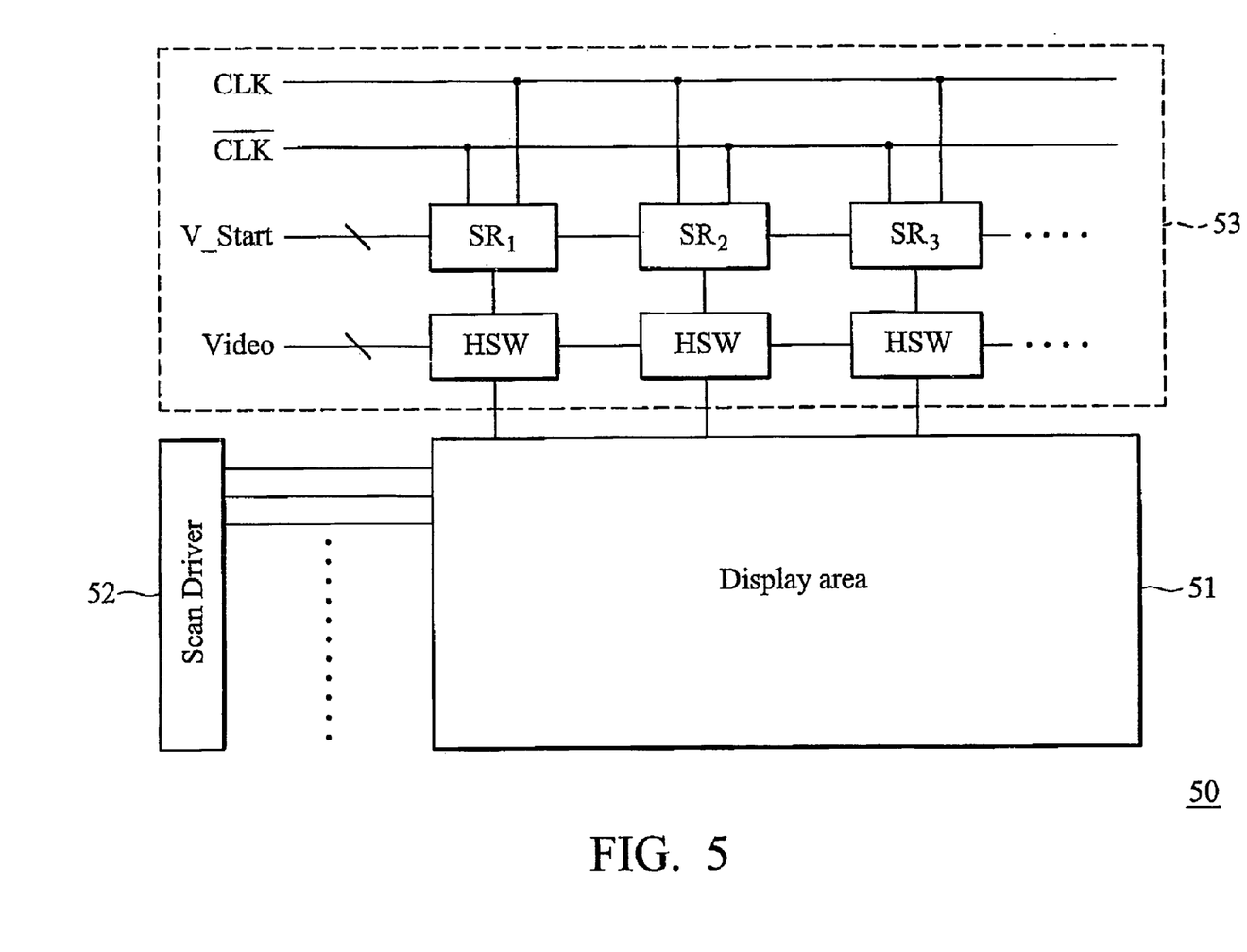
FIG. 5 is a schematic diagram of an LCD system with a signal driving circuit of the present invention.

The signal driving circuit of FIG. 3 can be used in a display device, such as liquid crystal display device (e.g., an LTPS driven LCD). Referring to FIG. 5, a display device 50 includes a display area 51, a scan driver 52, and a data driver 53. Each of the scan driver 52 and the data driver 53 can include the signal driving circuit of the present invention. Also, each of the scan driver 52 and the data driver 53 can include the shift register unit of the present invention. The scan driver 52 and the data driver 53 drive the display area 51 to display images.

Figure 4:
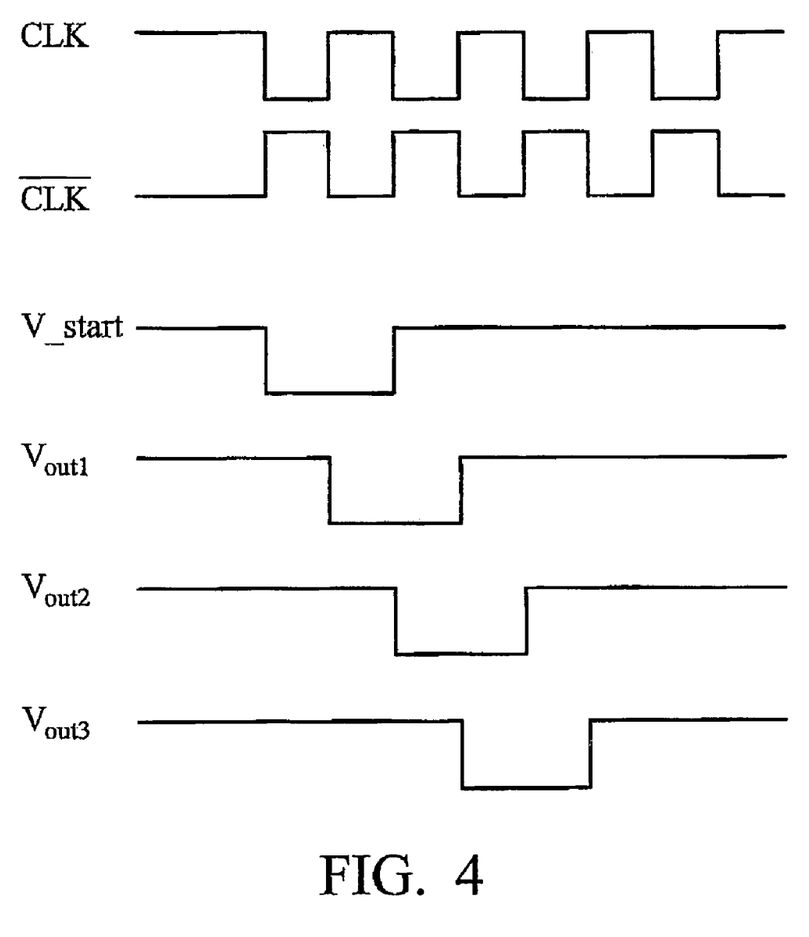
FIG. 4 is a timing diagram of the signal driving circuit as shown in FIG. 3.

FIG. 4 is a timing diagram of the signal driving circuit as shown in FIG. 3. The shift register signals Vout1, Vout2, and Vout3 are delayed a half clock period, and each shift register unit outputs a pulse after the previous stage shift register unit outputs a pulse at a predetermined period. Thus, the requirement for driving circuit for LTPS LCDs is achieved. In the present invention, the signal driving circuit for LPTS LCDs has a plurality of shift register units connected serially, and the structure of the shift register unit is the same as shown in FIG. 1. It should be noted that the control terminal of the first clock inversion circuit 10 in the present-stage shift register unit and the control terminal of the second clock inversion circuit 14 in the pre-stage shift register unit are controlled by the same clock signal.

Figure 6:
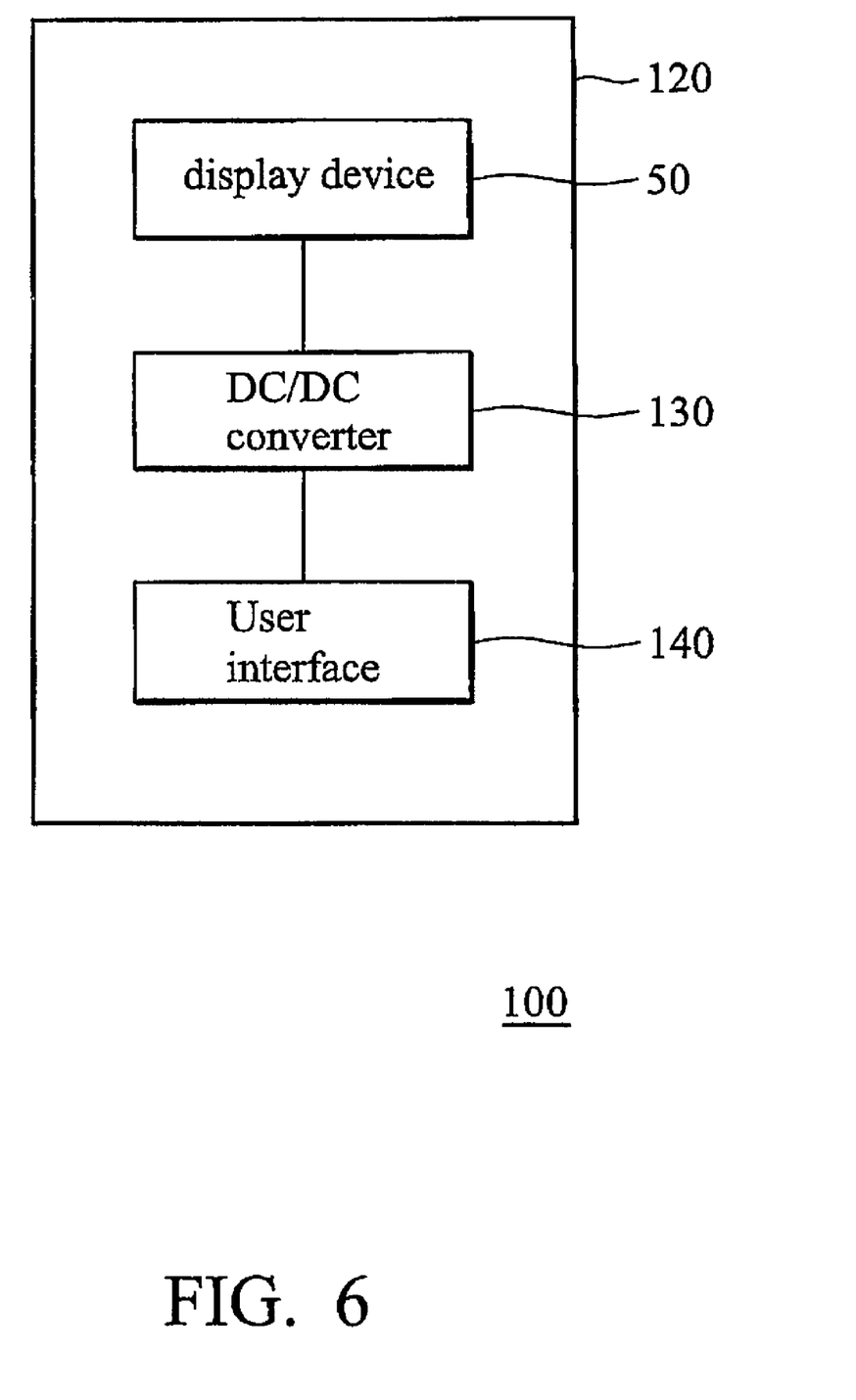
FIG. 6 is a schematic diagram of an electronic device incorporating a signal driving circuit in accordance with one embodiment of the present invention.

FIG. 6 schematically shows an electronic device 100 deploying a display device 50 described above. The display device 50 can be a liquid crystal display device. The electronic device 100 may be a portable device such as a PDA, notebook computer, tablet computer, cellular phone, or a display monitor device, etc. Generally, the electronic device 100 includes a housing 120, the display device 50 having the signal driving circuit shown in FIG. 3, a DC/DC converter 130, and a user interface 140, etc. Further, the DC/DC converter 130 is operatively coupled to the display device 50 and provides an output voltage to power the display device 50 and user interface 140. The user interface 140 is coupled to the display device 50 and used to control the display device 50, and the display device is used to display image.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A shift register unit for outputting a shift register signal according to a clock signal, an inverse clock signal and a start signal, the shift register unit comprising:
   a first clock inversion circuit receiving the start signal and the clock signal, and having a first output and a second output;
   an inverter coupled to the first output and the second output of the first clock inversion circuit to output the shift register signal; and
   a second clock inversion circuit receiving the shift register signal and the inverse clock signal, and having a first output and a second output coupled to the first output and the second output of the first clock inversion circuit respectively.

2. The shift register unit as claimed in claim 1, wherein the first clock inversion circuit and second clock inversion circuit comprises transistors that are all NMOS or PMOS type.

3. The shift register unit as claimed in claim 1, wherein the start signal is a signal output from another shift register unit.

4. The shift register unit as claimed in claim 1, wherein the inverter comprises:
   a first PMOS transistor having a first source coupled to a first voltage, a first gate and a first drain; and
   a second PMOS transistor having a second source coupled to the first drain, a second drain coupled to a second voltage and a second gate.

5. The shift register unit as claimed in claim 4, wherein the first clock inversion circuit comprises:
   a third PMOS transistor having a third source coupled to the first voltage, a third gate coupled to the start signal, and a third drain;
   a fourth PMOS transistor having a fourth source coupled to the third drain, a fourth gate and a fourth drain coupled to the second voltage together;
   a fifth PMOS transistor having a fifth source coupled to the third drain, a fifth drain coupled to the first gate, and a fifth gate; and
   a sixth PMOS transistor having a sixth source coupled to the start signal, a sixth drain coupled to the second gate, and a sixth gate coupled to the fifth gate to receive the clock signal.

6. The shift register unit as claimed in claim 1, wherein the second signal inversion circuit comprises:
   a seventh PMOS transistor having a seventh source coupled to the first voltage, a seventh gate coupled to the shift register signal, and a seventh drain;
   an eighth PMOS transistor having an eighth source coupled to the seventh drain, and an eighth drain, and an eighth gate coupled to the second voltage;
   a ninth PMOS transistor having a ninth source coupled to the seventh drain, a ninth drain coupled to the first gate, and a ninth gate; and
   a tenth PMOS transistor having a tenth source coupled to the shift register signal, a tenth drain coupled to the second gate, and a tenth gate coupled to the ninth gate to receive the inverse clock signal.

7. The shift register unit as claimed in claim 4, wherein the first voltage is a power voltage (VDD) and the second voltage is a ground voltage (VSS).

8. A signal driving circuit for LCD, comprising:
   first and second shift register units to output shift register signals sequentially according to a clock signal, an inverse clock signal and a start signal, wherein each of the first and second shift register units includes:
      a first clock inversion circuit having an input, a control terminal, a first output and a second output;
      an inverter having inputs coupled to the first output and the second output of the first clock inversion circuit, and an output; and
      a second clock inversion circuit having a control terminal, an input coupled to the output of the inverter, and a first output and a second output coupled to the first output and the second output of the first clock inversion circuit respectively.

9. The signal driving circuit as in claim 8, wherein the control terminal of the second clock inversion circuit of the first shift register unit and the control terminal of the first clock inversion circuit of the second register unit are coupled to the same clock signal.

10. The signal driving circuit as in claim 8, wherein the output of the inverter corresponds to the output of the first shift register unit, and wherein the output of the inverter is coupled to the input of the second clock inversion circuit.

11. The signal driving circuit as in claim 8, wherein the first shift register unit and the second shift register unit are functionally coupled in series, wherein output of the first shift register unit is coupled to input of the second shift register unit.

12. The signal driving circuit as claimed in claim 8, wherein the inverter comprises:
    a first PMOS transistor having a first source coupled to a first voltage, a first gate and a first drain; and
    a second PMOS transistor having a second source coupled to the first drain, a second drain coupled to a second voltage, and a second gate.

13. The signal driving circuit as claimed in claim 12, wherein the first clock inversion circuit comprises:
    a third PMOS transistor having a third source coupled to the first voltage, a third gate and a third drain;
    a fourth PMOS transistor having a fourth source coupled to the third drain, a fourth gate and a fourth drain coupled to the second voltage;
    a fifth PMOS transistor having a fifth source coupled to the third drain, a fifth drain coupled to the first gate, and a fifth gate; and
    a sixth PMOS transistor having a sixth source coupled to the third gate, a sixth drain coupled to the second gate, and a sixth gate coupled to the fifth gate.

14. The signal driving circuit as claimed in claim 13, wherein the second signal inversion circuit comprises:
    a seventh PMOS transistor having a seventh source coupled to the first voltage, a seventh gate coupled to the first drain, and a seventh drain;
    a eighth PMOS transistor having an eighth source coupled to the seventh drain, and an eighth drain and an eighth gate coupled to the second voltage;
    a ninth PMOS transistor having a ninth source coupled to the seventh drain, a ninth drain coupled to the first gate, and a ninth gate; and
    a tenth PMOS transistor having a tenth source coupled to the seventh gate and the first drain, a tenth drain coupled to the second gate, and a tenth gate coupled to the ninth gate.

15. The signal driving circuit buffer as claimed in claim 14, wherein, in the first shift register unit, the third gate is coupled to the start signal, the fifth gate and the sixth gate are coupled to the clock signal, and the ninth gate and the tenth gate are coupled to the inverse clock signal.

16. The signal driving circuit as claimed in claim 14, wherein, in the second shift register unit, the fifth gate and the sixth gate are coupled to the inverse clock signal, the ninth gate and the tenth gate are coupled to the clock signal, and the third gate is coupled to the shift register signal output from the first shift register unit.

17. The signal driving circuit as claimed in claim 12, wherein the first voltage is a power voltage (VDD), and the second voltage is a ground voltage (VSS).

18. A liquid crystal display device comprising an LCD display area, and the signal driving circuit of claim 8, wherein the signal driving circuit drives the LCD display area.

19. The liquid crystal display device as in claim 18, wherein the LCD display area is operatively coupled to the signal driving circuit.

20. An electronic device, comprising:
    a liquid crystal display device as in claim 18;
    an user interface coupled to the liquid crystal display device, controlling the liquid crystal display device; and
    a DC/DC converter operatively coupled to the liquid crystal display device, powering the liquid crystal display device to display image.

* * * * *